United States Patent [19]
Viscardi et al.
[11] Patent Number: 4,837,464
[45] Date of Patent: Jun. 6, 1989

[54] PHASE REGULATION CIRCUIT, PARTICULARLY FOR HORIZONTAL PHASE REGULATION IN DATA DISPLAYS

[75] Inventors: Roberto Viscardi, Lissone; Silvano Gornati, Casorezzo; Silvano Coccetti, Vittuone, all of Italy

[73] Assignee: SGS Microelettronica S.p.A., Catania, Italy

[21] Appl. No.: 55,954

[22] Filed: Jun. 1, 1987

[30] Foreign Application Priority Data

Jun. 18, 1986 [IT] Italy .............................. 20837 A/86

[51] Int. Cl.[4] ................................................ H03L 7/00
[52] U.S. Cl. ...................................... 307/511; 328/155
[58] Field of Search ........................ 307/511, 516, 521; 328/133, 134, 155

[56] References Cited

U.S. PATENT DOCUMENTS 3,863,080 1/1975 Steckler .......................... 307/511 X

*Primary Examiner*—Eugene R. LaRoche
*Assistant Examiner*—Steven J. Mottola
*Attorney, Agent, or Firm*—Guido Modiano; Albert Josif

[57] ABSTRACT

This circuit comprises a phase-lock stage receiving at the input a reference signal and the synchronism signal EN and generating at the output a triangular signal in phase correlation with the synchronism signal, a rectangular waveform generator receiving at the input the triangular signal and supplying at the output a rectangular signal, a drive element receiving the rectangular signal and generating a periodic control signal, as well as a phase comparator receiving at the input the triangular signal and the control signal, as well as a further reference signal and generating at the output an error signal correlated with the phase shift of the drive element and fed to the rectangular waveform generator. The reference signal fed to the phase-lock stage or to the phase comparator can be suitably varied within preset limits by an external potentiometer.

5 Claims, 3 Drawing Sheets

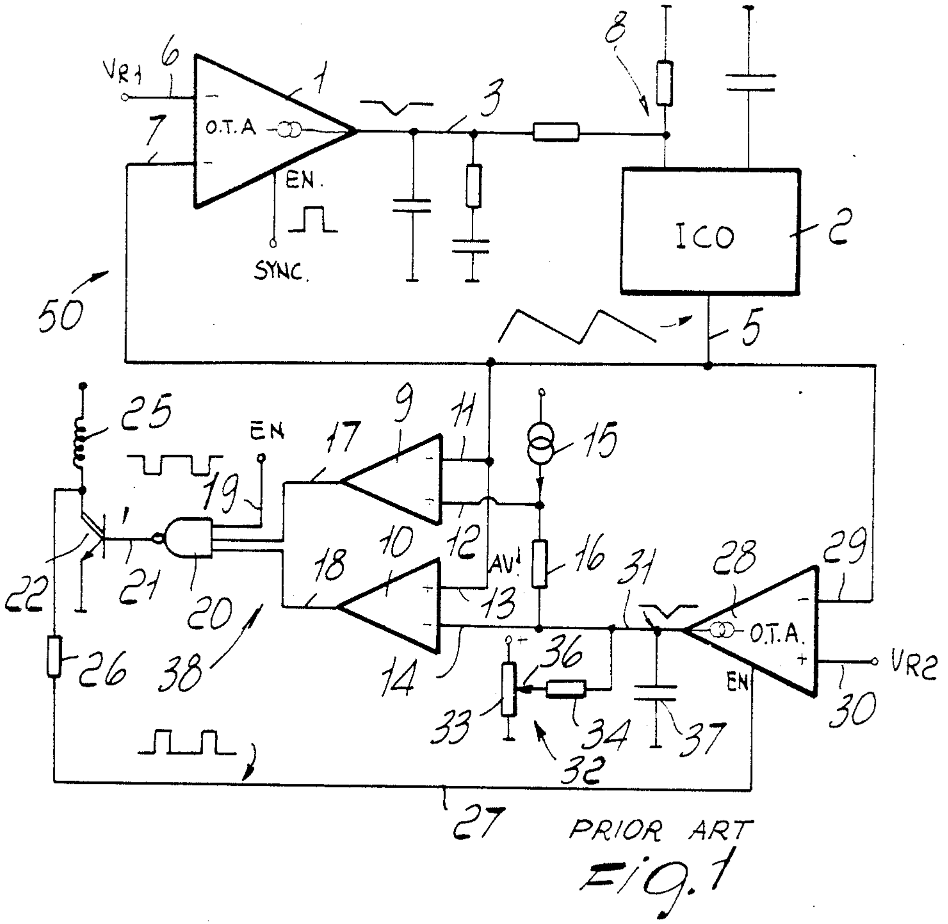
PRIOR ART
Fig. 1
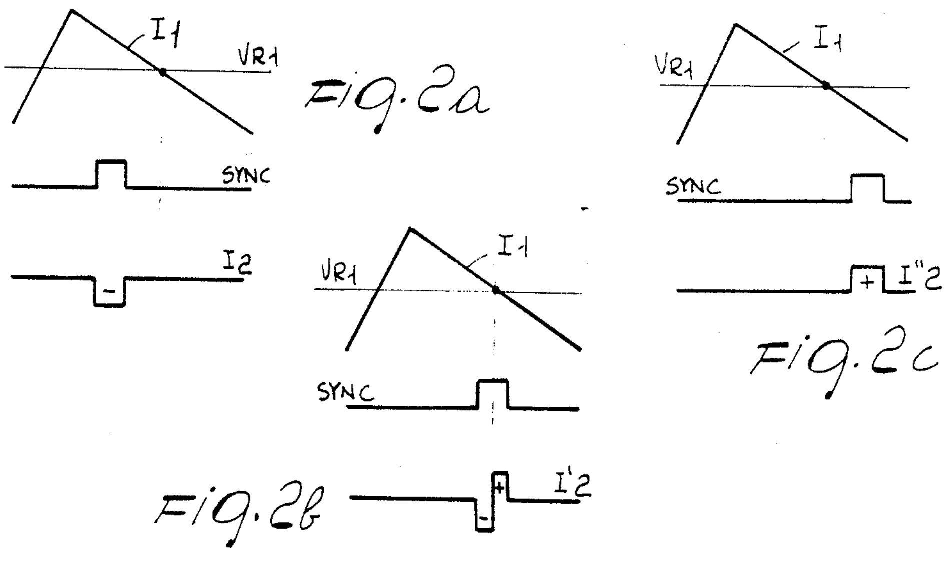
Fig. 2a
Fig. 2c
Fig. 2b

PHASE REGULATION CIRCUIT, PARTICULARLY FOR HORIZONTAL PHASE REGULATION IN DATA DISPLAYS

BACKGROUND OF THE INVENTION

The present invention relates to a phase regulation circuit, in particular for horizontal phase regulation in data displays.

As is known, in the field of displays of data fed by computers, the synchronism signals, both vertical and horizontal, originate from computers of different types, for which there are no unified norms as to duration and phase of the synchronism signals with respect to the video signal.

Accordingly, it is necessary to provide devices capable of rendering a specific data display compatible with the different types of computer. In particular, a regulation device of this kind must allow to recover the phase difference between the active front of the synchronism signal and the video signal in order to obtain the frame picture exactly centered on the screen of the data display. In particular, this phase difference has both a dynamic component, due to the behavior of the drive elements of the data display, and a static component to recover a fixed phase difference between the synchronism signals and the video signal.

Regulation devices are already known, interposed between the computer and the data display, capable of partially compensating this phase difference. In particular, a known phase regulation device comprises a phase-lock stage receiving a reference signal and the snychronism signal generated by the computer and capable of generating a triangular (saw-tooth) wave which, in the steady state, is synchronized with the external synchronism signal. The circuit furthermore comprises a horizontal pulse shaping block receiving the triangular waveform and capable of supplying at the output a series of rectangular pulses supplied to the row drive system of the display. This drive system, typically comprising a transistor, in turn generates a voltage which, suitably squared, is supplied to a phase comparator also receiving the triangular signal generated by the phase-lock stage and a second reference voltage, so as to compensate any phase shift caused by the drive system itself. For this purpose, the phase comparator generates an output signal fed to the square-wave generator so as to anticipate the pulse generated by the latter. Furthermore, to recover any static phase difference between the synchronism supplied by the computer on the video signal, a potentiometer system is provided, acting on the rectangular waveform generator and capable of varying the reference voltages of the latter so as to anticipate or delay the output pulse with respect to the synchronism signal. The more detailed circuit diagram of the known system is illustrated by way of example in FIG. 1.

This known device, though currently in widespread use, is not however free from disadvantages, due to the impossibility of recovering the existing phase difference when the latter exceeds certain levels. In particular, in practice it becomes impossible to recover phase differences greater than approximately one eighth of the period of the processed signal.

SUMMARY OF THE INVENTION

Accordingly, the aim of the present invention is to provide a phase regulation circuit, in particular for horizontal phase regulation in data displays, capable of providing a wide phase regulation between the synchronism signal and the video signal, compensating phase differences both due to static differences, caused by computers of different types, and due to dynamic shifts related to the drive components of the used displays.

Within this aim, a particular object of the present invention is to provide a phase regulation circuit capable of operating reliably, always ensuring a good dynamic phase compensation even for high static differences, greater than half the processed signal period.

Still another object of the present invention is to provide a phase regulation circuit which is conceptually simple and can be manufactured using the methods currently in use, in particular being easily integrated, and the costs whereof being in the same range as known devices.

The above aim and objects are achieved by a phase regulation circuit, in particular for horizontal phase regulation in data displays, according to the invention, comprising a phase-lock stage receiving at the inputs a first reference signal as well as a synchronism signal and generating at the output a triangular signal phase-correlated with said synchronism signal, a rectangular waveform generator, receiving at the inputs said triangular signal and supplying at the output a rectangular waveform signal, a drive element receiving said rectangular waveform signal and generating a periodic control signal, as well as a phase comparator receiving at the input said triangular signal and said periodic control signal, as well as a second reference signal and generating at the output a compensation signal for compensating dynamic phase differences produced by said drive element, said compensation signal being fed to said rectangular waveform generator, characterized in that to compensate static phase differences between said input synchronism signal and said periodic control signal, at least one of said reference signals is variable between presettable minimum and maximum values.

BRIEF DESCRIPTION OF THE DRAWINGS

Further features and advantages will become apparent from the description of two preferred, but not exclusive, embodiments, illustrated only by way of non-limitative example in the accompanying drawings, where:

FIG. 1 is a simplified circuit diagram of the phase regulator according to the prior art;

Figure 6:
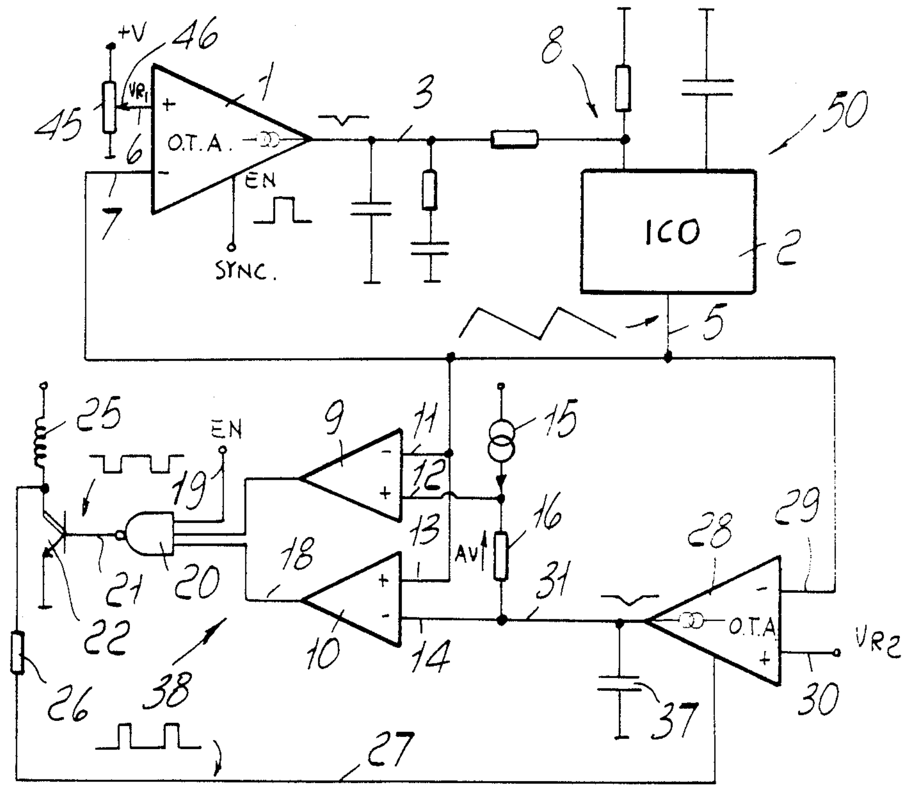
Figure 8:
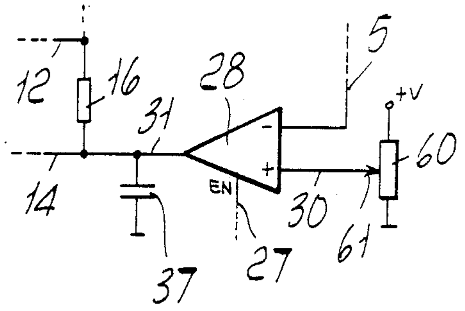

FIG. *2a, 2b, 2c,* 3, 4 and 5 illustrate waveforms related to the circuit of FIG. 1, to clarify its operation;

FIG. 6 is a simplified circuit diagram of a first embodiment of the regulator according to the invention;

FIGS. *7a–7c* illustrates waveforms related to the circuit according to the invention of FIG. 6; and FIG. 8 shows a different embodiment of a detail of the regulator of FIG. 6.

DESCRIPTION OF THE PREFERRED EMBODIMENTS

To understand the invention and the manner in which it solves the disadvantages featured by the prior art, the known regulator, illustrated in FIG. 1, is first described.

With reference to this figure, the known phase regulator generally comprises a phase-lock stage 50, a rectangular pulse shaper or generator 38, a phase comparator 28 as well as a drive element 22. In detail, the phase-lock stage 50 comprises a first phase comparator 1 having a pair of inputs 6 and 7 as well as an enable input EN receiving the external synchronism signal SYNC supplied, for example, by a computer. The positive input 6 of the phase comparator 1 is connected to a first fixed reference voltage $V_{R1}$, while its negative or inverting input 7 is connected to the line 5 at the output of the current-controlled oscillator 2 so that, when the synchronism signal arrives, the phase comparator 1 compares the reference signal at the input 6 with the triangular or saw-tooth waveform supplied at the input 7, and, according to the result of the comparison, generates a signal which, supplied at the output 3 and filtered by the components 8, is supplied to the oscillator 2 so as to vary its frequency and to keep the oscillator 2 locked with the horizontal synchronism signals provided by the external computer. The triangular signal supplied at the output 5 is furthermore supplied to the horizontal pulse shaper 38 which generates a rectangular waveform signal synchronized with the triangular waveform signal and therefore the external synchronism signal, this rectangular waveform being supplied to the display drive system, in this case comprising the transistor 22 connected to the inductor 25. The rectangular pulse of the pulse shaper 38 causes switching of the transistor 22 alternatively between the ON (saturation) and the OFF state required for the driving. Consequently, the collector of the transistor 22 will show a voltage signal correlated to the switching state of the transistor 22. This signal (flyback signal) can have a phase difference with respect to the synchronism signal due to the different storage times of the transistor 22. In order to compensate these phase differences, the flyback signal, taken on the collector of the transistor 22, is then supplied to a second phase comparator 28 at its enable input EN. This comparator 28 furthermore receives the triangular waveform signal generated by the oscillator 2 at the inverting input 29, as well as a second fixed reference voltage $V_{R2}$ supplied to the positive input 30 of the comparator. Accordingly, upon detection of the flyback pulse, the comparator 28 compares the triangular signal generated by the oscillator 2 with the fixed reference voltage $V_{R2}$ and supplies at the output an error signal correlated to the phase difference which, suitably filtered by the capacitor 37, is supplied to the input of the shaper block 38 which thus advances or delays the generated rectangular pulse by a time suitable to compensate the phase error. Furthermore, for recovering static phase errors due to the phase difference between the synchronism signal and the video signal generated by the computer, a static regulation is also provided, obtained by means of the potentiometer 32 such as to inject a positive or negative current towards the capacitor 37 to lower or raise the reference voltage at the input of the shaper 38 and thus achieve advance or delay of the drive pulse with respect to the snychronism signal.

In order to better understand the operation of the known device and the limits thereof, reference should be made to the waveforms illustrated in FIGS. 2 to 5. In detail, FIGS. 2*a*, 2*b* and 2*c* illustrate the behavior of the signal supplied at the output of the comparator 1 in three different phase relationships between the input synchronism signal and the triangular waveform signal generated by the oscillator 2. In detail, $I_1$ indicates the triangular signal supplied by the oscillator 2, $V_{R1}$ indicates the reference voltage supplied at the input 6 of the comparator 2, SYNC indicates the external pulse supplied by the computer. In the instance of FIG. 2*a*, when the synchronism pulse which enables the comparator 1 is received, the triangular signal is greater than the reference voltage, so that the signal $I_2$ at the output of the comparator 1 is negative, so as to generate, through the compounds 8, an error current supplied to the oscillator 2 such as to increase the frequency of the oscillator itself. In the case of FIG. 2*b*, the equality between the reference voltage $V_{R1}$ and $I_1$ occurs at the arrival of the synchronism pulse, obtaining the signal $I'_2$ having both a positive component and a negative component such as to prevent variation of the frequency of the triangular signal generated by the oscillator 2. Conversely, in the example of FIG. 2*c* the SYNC pulse occurs when the triangular current is lower than the reference voltage, thus obtaining the positive signal $I''_2$ which causes a reduction in the oscillator frequency. Consequently, the stage 50 evolves so as to modify the frequency of the triangular signal generated by the oscillator 2 until isofrequentiality of the desired phase, with respect to the timing signal SYNC, are achieved.

Figure 3:
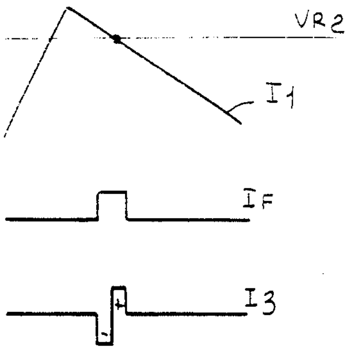

The triangular signal, thus locked to the synchronism, is then also supplied to the second phase comparator 28. The waveforms related to the operation of this comparator are illustrated in FIG. 3, wherein $I_1$ again indicates the triangular waveform generated by the oscillator 2, $V_{R2}$ indicates the fixed reference voltage supplied at the positive input to the comparator 28, while $I_F$ indicates the flyback pulse taken through the line 27 from the collector of the transistor 22 and fed at the enable input EN of the comparator 28. Similarly to the first comparator, the second phase comparator 28 compares the triangular waveform with the reference voltage when enabled by an oncoming enable pulse, in this case constituted by the flyback pulse. Depending on the comparison, the comparator 28 thus generates at the output a signal $I_3$ which accounts for the phase difference existing between the triangular signal and the flyback pulse, which signal is supplied to the shaper 38 which thus advances or delays its triangular pulse, so as to obtain in practice a further phase-lock system to synchronize the horizontal oscillator (and therefore the external synchronism) with the flyback pulse. FIG. 3 illustrates the stable situation in which the signal $I_3$ has both a positive component and a negative component such as to maintain the same existing phase relationship reached before.

Figure 4:
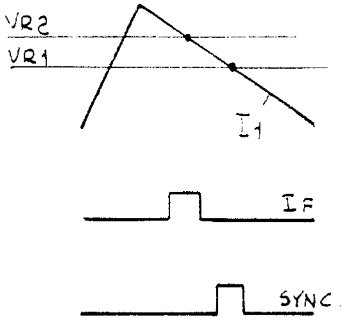

FIG. 4 illustrates waveforms depicting the phase relationship between the flyback pulse, the horizontal synchronism pulse and the triangular waveform. To adjust this phase relationship, the comparator 28 cooperates with the rectangular pulse shaper 38 which, as can be observed in the figure, is composed of a pair of comparators 9 and 10 and of a logic NAND gate 20. In detail, the comparator 9 is connected with its negative input 11 to the output of the oscillator 2, and, with its positive input 12, is connected to a terminal of a resistor 16 supplied by a current source 15 such as to cause, at the ends of the resistor, a fixed voltage drop $\Delta V$. The other terminal of the resistor 16 is connected at the negative input of the comparator 10, connected with its positive input 13 to the output of the oscillator 2. The comparators 9 and 10 then have respective output terminals 17 and 18 supplied, together with the line 19 connected to an enable signal, to the logic NAND gate 20, the output 21 whereof is applied to the base of the transistor 22.

Figure 5:
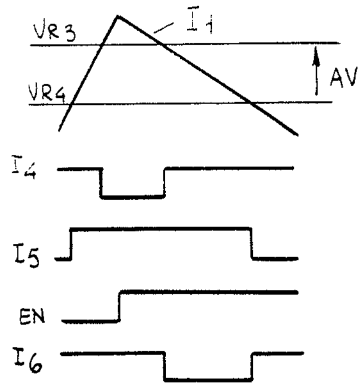

The operation of the shaper 38 is clearly deducible from FIG. 5, illustrating the triangular waveform $I_1$ supplied by the oscillator 2, the two comparison voltages $V_{R3}$ and $V_{R4}$ supplied respectively at the input 12 and at the input 14 of the comparators 9 and 10, as well as the output signals $I_4$ and $I_5$ present at the outputs 17 and 18 of the comparators. As is clear, the difference between the two reference voltages $V_{R3}$ and $V_{R4}$ is exactly equal to the drop on the resistor 16 caused by the current injected by the source 15. Thus, in order to perform static phase control between the external synchronism signal (and therefore the triangular waveform correlated therewith) and the flyback pulse related to the signal $I_6$ generated at the output by the gate 20, by means of the potentiometer 32 it is possible to vary the two reference voltages $V_{R3}$ and $V_{R4}$, keeping in any case constant their voltage difference and therefore the duration of the pulse $I_6$. In practice, the potentiometer of the known system comprises a voltage divider formed by the resistors 33 and 34, wherein the resistor 34 is connected to the slider 36 moveable on the resistor 33. In this manner there is a simultaneous and equal variation of the reference voltages of the comparators 9 and 10, and therefore of the phase difference between the output signal $I_6$ of the shaper 38 and the external synchronism.

In practice, as can be seen, by moving the slider of the resistor 33, a positive or negative current is injected on the capacitor 37 such as to generate a greater or smaller voltage at the input of the comparators 9 and 10. Consequently there is an advance or a delay of the pulse generated by the phase shaper 38 as well as of the flyback pulse obtained from the collector of the transistor 22. Bearing in mind the waveforms illustrated in FIG. 3, from the foregoing it is clear that the flyback pulse can be advanced or delayed only by half its duration (with respect to the balance situation illustrated in FIG. 3) to prevent the current $I_3$ from becoming all positive or all negative. Indeed, in this case there would be no possibility of dynamic phase control through the phase comparator 28. Since in the systems in use the flyback pulse typically has a duration of approximately 8 $\mu$s, the maximum manual regulation for compensating static phase differences is approximately $\pm 4$ $\mu$s. Since the period of the signal corresponding to a deflection through 360° is equal to 64 $\mu$s, in practice a phase regulation of $\pm 22.5°$ is obtained, which in some cases is too limited.

It should be furthermore noted that according to the prior art, the regulation for compensating static phase differences between the synchronism signal and the video signal, which causes shift of the signal at the output from the shaper circuit and therefore of the flyback pulse with respect to the triangular waveform $I_1$ (see FIG. 3), affects the possibility of dynamic regulation, so that, though maintaining an overall regulation possibility of 45°, this regulation possibility is not symmetrical as to delay or advance the pulse, but can also be practically nil in one of the two cases.

An embodiment of the circuit according to the invention is instead illustrated in FIG. 6. Since the regulator according to the invention has a general scheme similar to the one in FIG. 1, the same reference numerals have been used for the components common to the prior art. Thus, with reference to FIG. 6, the phase regulator according to the invention again comprises a phase-lock stage 50, a horizontal pulse shaper 38 and a comparator 28. The phase-lock stage comprises the phase comparator 1 and the current-controlled oscillator 2 connected as described so as to generate on the line 5 a triangular signal supplied both to the shaper 38 and to the comparator 28. In particular, the comparator 1 is of the type with high-impedance current output, for example an operational transconductance amplifier O.T.A.. As in the prior art, the triangular signal is supplied to the negative input of the comparator 1, while at its positive input 6 is supplied a reference voltage, indicated here, by analogy, by $V_{R1}$. Differently with respect to the prior art, wherein this reference voltage was obtained by integrated voltage dividers (as in the case of the reference voltage $V_{R2}$), here this first reference voltage is variable and is obtained by means of a potentiometer 45, the slider 46 whereof is connected to the input 6.

As in the prior art, the pulse shaper 38 comprises a pair of comparators 9 and 10 connected respectively at the negative input 11 and at the positive input 13 to the line 5, while the positive input 12 of the comparator 9 is connected to a first terminal of the resistor 16, the other terminal whereof is connected to the negative input 14 of the comparator 10. Also in this case, a current source 15 is provided such as to cause a fixed voltage drop $\Delta V$ on the resistor 16. The outputs 17 and 18 of the comparators 9 and 10 are supplied, together with an enable signal EN, to the logic NAND gate 20 the output 21 whereof controls at the base the transistor 22 of the drive system. This transistor 22 is connected with its collector at one side to the inductor 25 of the display system and on the other to the line 27 which includes the resistor 26 and leads to the enable input EN of the phase comparator 28. Also in this case, the comparator 28 has a negative input 29 receiving the triangular signal generated by the oscillator 2 and a positive input 30 connected to a second reference voltage $V_{R2}$, here, too, of a preset value, as in the example according to the prior art. Differently from the prior art, the output 31 of the comparator 28 no longer has the potentiometer system 32 but merely the filter capacitor 37 and is sent directly to the shaper 38.

By virtue of the arrangement of a variable reference voltage at the positive input of the phase comparator 1, it is thus possible to perform static phase compensation by acting directly on the reference voltage compared with the triangular signal supplied by the oscillator 2 at reception of an input synchronism pulse, achieving in this manner a greater compensation dynamics.

Figure 7A:
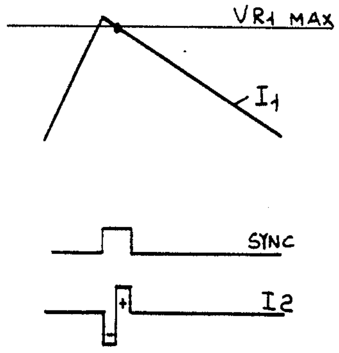
Figure 7B:
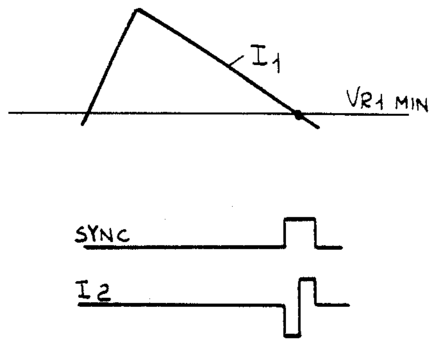
Figure 7C:
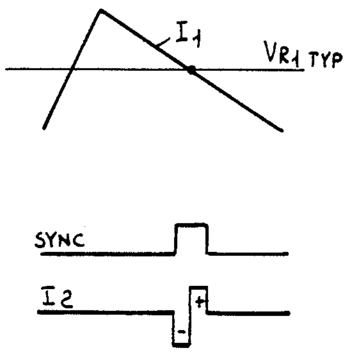

The waveforms related to the phase-lock stage 50 are illustrated in FIGS. 7*a*, 7*b* and 7*c* related to three different regulations of the slider 46 so as to obtain the maximum, minimum or typical reference voltage. As can be see in FIG. 7*a*, the maximum possibility of regulation corresponds to the case in which the maximum reference voltage ($V_{R1MAX}$) is proximate to the cusp or apex of the triangular shape generated by the oscillator 2. In this case, the system evolves so as to reach the stable situation represented with the synchronism pulse at the intersection between the maximum value reference voltage and the falling edge of the triangular signal, and an output signal $I_2$ of the comparator 1 is obtained as illustrated in FIG. 7*a*, at the synchronism impulse. FIG. 7*b* instead illustrates the case in which the potentiometer 45 has been adjusted so as to obtain the minimum reference voltage value (indicated in the figure by $V_{R1MIN}$). This value, which is proximate to the minimum value of the signal generated by the oscillator 2, gives rise to the phase relationship between the synchronism pulse SYNC and the triangular waveform illustrated in the figure. Also in this case, after achievement of a steady state, the output signal $I_2$ is as illustrated in the figure. Instead, the example 7*c* illustrates the typical regulation, wherein the reference voltage assumes the value $V_{R1TYP}$ with the relationship between $I_1$, the synchronism signal SYNC and the output signal $I_2$ illustrated in the figure. This situation corresponds to a nil static phase difference between the synchronism signal and the triangular shape, while the situation of FIG. 7*a* corresponds to a phase difference $<-90°$ and FIG. 7*b* to a static phase difference $>90°$.

FIG. 8 illustrates a different embodiment according to which the reference voltage which can vary is no longer the reference $V_{R1}$ fed to the phase comparator 1, but the reference $V_{R2}$ fed to the comparator 28.

In particular, FIG. 8 only illustrates the detail in which it differs from FIG. 1. As can be seen, in FIG. 8 the comparator 28 with its negative input is still connected to the output 5 of the oscillator 2, while with its positive input 30 it is connected to the slider 61 of a potentiometer 60. For the rest, at the enable input EN of the comparator 28 is connected the line 27 carrying the flyback pulses, while its output 31 is supplied directly to a terminal of the resistor 16 leading to the input 14 of the comparator 10, while the other terminal of the resistor 16 is connected to the line 12 and to the source 15. The filter capacitor 37 is furthermore provided.

When the embodiment of FIG. 8 is applied in the circuit of FIG. 1, the phase regulator behaves, regarding the phase-lock loop 50 and the pulse shaper 38, as illustrated in FIGS. 2*a*–2*c* and 4, while differently from FIG. 3, the reference voltage $V_{R2}$ is variable and movable along the falling portion of the output signal $I_1$. Consequently, the voltage on the terminals 12 and 14 of the components 9 and 10 is raised or lowered, and therefore the flyback pulse is advanced or delayed. Differently from the prior art, the phase shift of the flyback pulse of FIG. 3 is accompanied by a corresponding shift of the crossing point of $V_{22}$ with $I_1$, thus eliminating the problem of the feasibleness of the dynamic phase compensation through the phase-lock loop 50. In the solution of FIG. 8 a lower dynamic range with respect to the solution of FIG. 6 will be achieved in any case, since the variation of the voltage at the output 31 is limited by the fact that $V_{R3}$ (reference voltage at the positive input 12 of the comparator 9) must not exceed the apex of the triangular waveform $I_1$ and on the other hand $V_{R4}$ (corresponding to the reference voltage supplied at the negative input 14 of the comparator 10) cannot be smaller than the minium level of the same triangular waveform $I_1$ (reference should be made to FIG. 5, at the top) to avoid varying the drive pulses of the transistor 22. In any case, even with the embodiment of FIG. 8 a remarkable gain is achieved with respect to the regulator according to the prior art.

Moreover, it is possible to combine the embodiment of FIG. 6 with the one of FIG. 8, providing both a variable reference voltage on the input of the phase comparator 1 and a variable reference voltage on the positive input 30 of the phase comparator 28 and making them vary in opposition.

As can be seen from the previous description, the invention fully achieves the intended aims. Indeed, a phase regulator has been provided having a very simple structure which allows to remarkably increase the possiblity of allowed phase regulation, allowing a regulation between the synchronism phase and the video signal phase within wide margins.

In particular, the dynamic gain of the comparator 28 does not change following static phase regulation as occurred in the conventional system, by virtue of the fact that, regardless of the static compensation, the flyback pulse always remains locked to the signal provided by the oscillator 2, so that the presence of a static phase compensation does not affect the possibility of also performing a dynamic compensation to account for the delays introduced by the type of transistor 22 used and by its aging.

The invention thus conceived is susceptible to numerous modifications and variations, all of which are within the scope of the inventive concept.

Moreover, all the details may be replaced with other technically equivalent elements.

We claim:

1. A phase regulation circuit, in particular for horizontal phase regulation in data displays, comprising a phase-lock stage receiving a first reference signal and a synchronism signal and generating a triangular signal phase-correlated with said synchronism signal, a rectangular waveform generator, receiving said triangular signal and supplying a rectangular waveform signal, a drive element receiving said rectangular waveform signal and generating a periodic control signal, and a phase comparator receving said triangular signal, said periodic control signal and a second reference signal and generating a compensation signal for compensating dynamic phase differences produced by said drive element, said compensation signal being fed to said rectangular waveform generator, wherein at least one of said reference signals is variable between presettable minimum and maximum values, thereby compensating static phase differences between said synchronism signal and said periodic control signal.

2. A regulation circuit according to claim 1, wherein said at least one of said reference signals which is variable is said first reference signal.

3. A regulation circuit according to claim 1, comprising a potentiometer having a movable slider connected to said phase-lock stage for supplying a variable reference voltage constituting said first reference signal.

4. A regulation circuit according to claim 1, wherein said at least one of said reference signal which is variable is said second reference signal.

5. A regulation circuit according to claim 1, comprising a potentiometer having a movable slider connected to said phase comparator for supplying a variable reference voltage constituting said second reference signal.

* * * * *